(12) United States Patent
Angioni

(10) Patent No.: US 11,152,584 B2
(45) Date of Patent: Oct. 19, 2021

(54) QUANTUM DOTS WITH SALT LIGANDS WITH CHARGE TRANSPORTING PROPERTIES

(71) Applicant: SHARP KABUSHIKI KAISHA, Osaka (JP)

(72) Inventor: Enrico Angioni, Abingdon (GB)

(73) Assignee: Sharp Kabushiki Kaisha, Osaka (JP)

( * ) Notice: Subject to any disclaimer, the term of this patent is extended or adjusted under 35 U.S.C. 154(b) by 31 days.

(21) Appl. No.: 16/274,598

(22) Filed: Feb. 13, 2019

(65) Prior Publication Data

US 2020/0259110 A1 Aug. 13, 2020

(51) Int. Cl.
| | | |
|---|---|---|
| *H01L 29/06* | (2006.01) | |
| *H01L 21/20* | (2006.01) | |
| *H01L 51/50* | (2006.01) | |
| *H01L 51/56* | (2006.01) | |
| *H01L 21/02* | (2006.01) | |

(Continued)

(52) U.S. Cl.
CPC ...... *H01L 51/502* (2013.01); *H01L 21/02601* (2013.01); *H01L 21/02628* (2013.01); *H01L 33/06* (2013.01); *H01L 33/502* (2013.01); *H01L 51/5056* (2013.01); *H01L 51/5072* (2013.01); *H01L 51/56* (2013.01)

(58) Field of Classification Search
CPC ... H01L 51/502; H01L 51/56; H01L 51/5072; H01L 51/5056; H01L 33/06; H01L 33/502; H01L 51/5092; H01L 51/5096; H01L 51/0039; H01L 33/504; H01L 51/0037; H01L 51/5012; H01L 51/5206; H01L 21/02568; H01L 51/0003; H01L 51/009; H01L 51/0092; H01L 51/426; H01L 51/5221; H01L 51/0005; H01L 51/0038; H01L 51/5016; H01L 51/5076; H01L 21/02601; H01L 21/02628
See application file for complete search history.

(56) References Cited

U.S. PATENT DOCUMENTS

| | | | |
|---|---|---|---|
| 7,910,400 B2 * | 3/2011 | Kwon | B82Y 30/00 438/99 |
| 9,099,663 B1 * | 8/2015 | Chuang | H01L 31/0272 |
| 9,653,630 B2 | 5/2017 | Suh et al. | |

(Continued)

OTHER PUBLICATIONS

Balazs et al., Counterion-Medicated Ligand Exchange for PbS Colloidal Quantum Dot Superlattices, ACS Nano, vol. 9, No. 12, pp. 11951-11959, 2015.

(Continued)

*Primary Examiner* — Shouxiang Hu
(74) *Attorney, Agent, or Firm* — Renner, Otto, Boisselle & Sklar, LLP

(57) ABSTRACT

A quantum dot includes a salt ligand at an outer surface thereof, the salt ligand including an anion and a cation, the cation having charge transporting properties. A light-emitting device includes an anode, a cathode, and an emissive layer disposed between the anode and the cathode, the emissive layer including multiple instances of the quantum dot. In some embodiments, the emissive layer is a crosslinked layer formed by depositing a mixture including the quantum dots on a layer, and subjecting at least a portion of the mixture to external activation stimuli to form the emissive layer including quantum dots dispersed in a crosslinked matrix.

20 Claims, 6 Drawing Sheets

(51) Int. Cl.
*H01L 33/50* (2010.01)
*H01L 33/06* (2010.01)

(56) References Cited

U.S. PATENT DOCUMENTS

| 2008/0206565 A1* | 8/2008 | Takahashi | H01L 51/5012 |
| | | | 428/403 |
| 2018/0151817 A1* | 5/2018 | Cho | H01L 51/0037 |
| 2018/0254421 A1* | 9/2018 | Kinge | H01L 51/56 |

OTHER PUBLICATIONS

Niu et al., Inorganic halogen ligands in quantum dots: I-, Br-, Cl- and film fabrication through electrophoretic deposition, Phys. Chem. Chem. Phys., 2013, 15, pp. 19595-19600.
Ning et al., Solar Cells Based on Inks of n-Type Colloidal Quantum Dots, ACS Nano, vol. 8, No. 10, pp. 10321-10327, 2014.
Kim et al., One-Step Deposition of Photovoltaic Layers Using Iodide Terminated PbS Quantum Dots, J. Phys. Chem. Lett. 2014, 5, pp. 4002-4007.

\* cited by examiner

QUANTUM DOTS WITH SALT LIGANDS WITH CHARGE TRANSPORTING PROPERTIES

TECHNICAL FIELD

The present disclosure relates to a structure for quantum dots and to their application in light-emitting devices. The quantum dots may provide high quantum efficiency and high carrier mobility. The light-emitting devices that include the quantum dots may be implemented in display applications, for example, high resolution, multicolor displays. The present disclosure further relates to methods of producing the quantum dots and the light-emitting devices.

BACKGROUND ART

When quantum dots are included in an emissive layer in a quantum dot light emitting diode (QD-LED), they are not reaching maximum theoretical efficiency. One of the reasons is crystal defects on or near the surface of the nanocrystal core or shell. Ligands may be included as a part of the quantum dot to passivate crystal defects (and, e.g., in some embodiments to provide solubility in common solvents). But another reason for not reaching maximum theoretical efficiency is that ligands included as part of the quantum dots are insulators and bulky, and do not allow for maximum charge transport and packing in the solid state.

Conventionally, small ligands are used in order to achieve better packing of quantum dots. For example, halide capping is a common strategy to passivate the surface of colloidal quantum dots. Usually these small ligands are exchanged only after synthesis of the quantum dots. For example, U.S. Pat. No. 9,653,630 (Suh et al., patented May 16, 2017) and Balazs et al., Counterion-Mediated Ligand Exchange for PbS Colloidal Quantum Dot Superlattices, ACS Nano, Vol. 9, No. 12, pgs. 11951-11959, 2015 describe that this can be done in the solid state where native ligands are exchanged after the quantum dot film is deposited. As another example, each of Niu et al., Inorganic halogen ligands in quantum dots: $I^-$, $Br^-$, $Cl^-$ and film fabrication through electrophoretic deposition, Phys. Chem. Chem. Phys., 2013, 15, pgs. 19595-19600; Ning et al., Solar Cells Based on Inks of n-Type Colloidal Quantum Dots, ACS Nano, Vol. 8, No. 10, pgs. 10321-10327, 2014; and Kim et al., One-Step Deposition of Photovoltaic Layers Using Iodide Terminated PbS Quantum Dots, J. Phys. Chem. Lett. 2014, 5, pgs. 4002-4007 describe that this can be done in solution where native ligands are swapped for shorter ones whilst still in solution.

CITATION LIST

U.S. Pat. No. 9,653,630 (Suh et al., patented May 16, 2017).

Balazs et al., Counterion-Medicated Ligand Exchange for PbS Colloidal Quantum Dot Superlattices, ACS Nano, Vol. 9, No. 12, pgs. 11951-11959, 2015.

Niu et al., Inorganic halogen ligands in quantum dots: $I^-$, $Br^-$, $Cl^-$ and film fabrication through electrophoretic deposition, Phys. Chem. Chem. Phys., 2013, 15, pgs. 19595-19600.

Ning et al., Solar Cells Based on Inks of n-Type Colloidal Quantum Dots, ACS Nano, Vol. 8, No. 10, pgs. 10321-10327, 2014.

Kim et al., One-Step Deposition of Photovoltaic Layers Using Iodide Terminated PbS Quantum Dots, J. Phys. Chem. Lett. 2014, 5, pgs. 4002-4007.

SUMMARY OF INVENTION

The present disclosure provides a new structure for quantum dots that may provide high quantum efficiency and high carrier mobility in the solid state. The present disclosure also provides methods of producing these quantum dots, light-emitting devices including these quantum dots, and methods of producing the light-emitting devices. These quantum dots that exhibit high quantum efficiency and high carrier mobility in the solid state may allow for fabrication of efficient QD-LED devices.

In accordance with one aspect of the present disclosure, a quantum dot includes a salt ligand at an outer surface of the quantum dot, the salt ligand including an anion and a cation, the cation having charge transporting properties.

In some embodiments, the cation of the salt ligand has hole transporting properties. The cation of the salt ligand may be cross-linkable.

In some embodiments, the cation of the salt ligand has electron transporting properties. The cation of the salt ligand may be cross-linkable.

In some embodiments, the salt ligand is a first salt ligand; and the quantum dot further includes a second salt ligand including an anion and a cation, the second ligand different than the first salt ligand. In some embodiments, the anion of the second ligand and the anion of the first ligand are the same type; and the cation of the second ligand is different than the cation of the first ligand. In some embodiments, the anion of the second ligand is different than the anion of the first ligand; and the cation of the second ligand is different than the cation of the first ligand. In some embodiments, the cation of one of the first ligand and the second ligand has hole transporting properties; and the cation of the other of the first ligand and the second ligand has solubility properties in a solvent. In some embodiments, the cation of one of the first ligand and the second ligand has electron transporting properties; and the cation of the other of the first ligand and the second ligand has solubility properties in a solvent. In some embodiments, the cation of one of the first ligand and the second ligand has electron transporting properties; and the cation of the other of the first ligand and the second ligand has hole transporting properties. In some embodiments, the cation of one of the first ligand and the second ligand is cross-linkable.

In some embodiments, the quantum dot further includes an additional salt at the surface of the quantum dot.

In accordance with another aspect of the present disclosure, a light-emitting device includes: an anode; a cathode; and an emissive layer disposed between the anode and the cathode, the emissive layer including quantum dots as described in any one of the above-mentioned embodiments.

In some embodiments, the light-emitting device further includes a hole transport layer disposed between the anode and the emissive layer, wherein the hole transport layer is crosslinked with at least a portion of the cations of the ligands of the quantum dots.

In some embodiments, the light-emitting device further includes an electron transport layer disposed between the cathode and the emissive layer, wherein the electron transport layer is crosslinked with at least a portion of the cations of the ligands of the quantum dots.

In accordance with another aspect of the present disclosure, a method of forming an emissive layer of a light-emitting device includes: depositing a mixture including quantum dots on a layer, at least a portion of the quantum dots each including a salt ligand at an outer surface of the quantum dot, the salt ligand including an anion and a cation, the cation having charge transporting properties; and subjecting at least a portion of the mixture to external activation stimuli to form the emissive layer including quantum dots dispersed in a crosslinked matrix.

In some embodiments, the external activation stimuli is one or more of light, pressure, temperature, and change in pH.

In some embodiments, the layer is a hole transport layer including a cross-linkable hole transport material, and the subjecting the at least a portion of the mixture to external activation stimuli crosslinks the hole transport layer with the matrix of the emissive layer.

In some embodiments, the layer is an electron transport layer including a cross-linkable electron transport material, and the subjecting the at least a portion of the mixture to external activation stimuli crosslinks the electron transport layer with the matrix of the emissive layer.

The foregoing and other features of the invention are hereinafter described in greater detail with reference to the accompanying drawings.

DESCRIPTION

Figure 1:
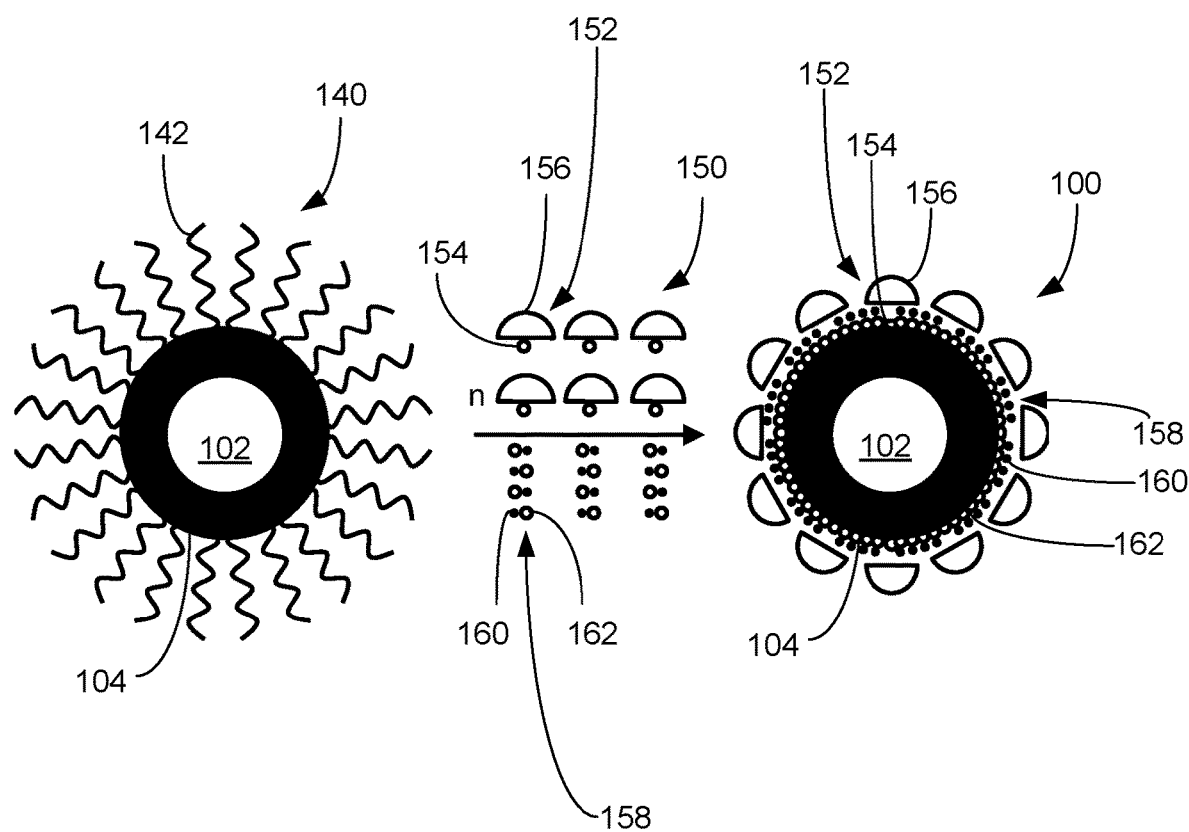
FIG. 1 is a schematic illustration of an exemplary ligand exchange in accordance with the present disclosure.

Referring now to the drawings in detail and initially to FIG. 1, a schematic illustration of an exemplary ligand exchange in accordance with the present disclosure is shown. As shown, a quantum dot 140 is provided. While FIG. 1 shows a single quantum dot 140, it will be appreciated that the ligand exchange disclosed herein may involve multiple quantum dots (e.g., the same type or different types). The quantum dot 140 is a core-shell quantum dot that includes nanocrystalline core 102, shell 104, and ligands 142. In some embodiments, the quantum dot 140 may be formed by co-crystallizing the core 102 with a shell 104 of a compatible material 102. Exemplary quantum dots core and shell materials include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, $ZnSe_xTe_{1-x}$, perovskites of the form $ABX_3$, $Zn_wCu_zIn_{1-(w+z)}S$, and carbon, where $0 \leq w, x, y, z \leq 1$. In some embodiments, the quantum dot materials may be doped with one or more other elements. Examples of such elements include Ga, In, S, Sn, Ge, Si, Te Cd, Zn, and/or Bi. In one exemplary implementation, in the case of a core and/or shell made of InP, the InP may be doped with Ga.

The quantum dots may be embodied as nanoparticles. The formed core and shell may be surrounded by ligands 142. The ligands 142 may passivate crystal defects in the core-shell quantum dot, and in some embodiments may provide for improved solubility in some solvents. Exemplary ligands 142 include alkyl, -alkenyl, -alkynyl or aryl (linear, branched or cyclic) thiols with 1 to 30 atoms of carbon; alkyl, -alkenyl, -alkynyl or aryl (linear, branched or cyclic) carboxylic acids with 1 to 30 atoms of carbon; tri-alkyl, -alkenyl, -alkynyl or aryl (linear, branched or cyclic) phosphine oxides with 1 to 60 atoms of carbon. It will be appreciated that while the present disclosure primarily describes the quantum dots as core-shell quantum dots, in some embodiments the quantum dots may not be of the core-shell type. The non-core-shell type quantum dots may be made from one or more of the above-mentioned materials, and the quantum dots 100 including the one or more salt ligands in accordance with the present disclosure may not include a core-shell configuration. In other embodiments, the quantum dots may be in a core-multiple shell configuration. As such, the quantum dots may include more than one shell. The core-multiple shell quantum dots may be made from one or more of the above-mentioned materials, and the quantum dots 100 including the one or more salt ligands in accordance with the present disclosure may include multiple shells.

As shown in FIG. 1, a ligand system 150 is introduced in order to effectuate ligand exchange of the quantum dot 140. As described in more detail below, in some embodiments, one, two, or more salt ligands are introduced by ligand exchange in solution (e.g., before formation of a quantum dot film). In other embodiments, one, two, or more salt ligands are introduced by ligand exchange in solid state (e.g., after formation of a quantum dot film). In other embodiments, one or more of the salt ligands is introduced by ligand exchange in solution (e.g., before formation of a quantum dot film), and one or more of the salt ligands is introduced in the solid state (e.g., after depositing and/or formation of a quantum dot film/layer).

The ligand system 150 may be provided in a solution (e.g., a solvent). In embodiments where the ligand exchange is conducted in solution (e.g., before formation of a quantum dot film), the quantum dots 140 and the ligand system 150 may be provided together in the solvent. In embodiments where the ligand exchanged is conducted in solid state (e.g., after formation of a quantum dot film), the ligand system 150 may be provided in the solvent and brought into contact with the solid layer. Exemplary solutions include apolar solvents (e.g., hexane, octane, etc.) and more polar solvents (e.g., methanol, ethanol, isopropanol, water, dimethylformamide, etc). Other exemplary solvents include, but are not limited to the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA).

The ligand system 150 includes a salt ligand 152 that is composed by a small anion 154 and a cation 156 that has charge transporting properties. In accordance with the present disclosure, the salt 152 may also be referred to as a salt ligand in that it is exchanged with the ligand 142 during ligand exchange. The small anions 154 replace the ligands 142, and the cations 156 having charge transporting properties counter balance the excess of charge and may allow for solubility in solution. Exemplary anions 154 include one or more halogen ions (e.g., $F^-$, $Cl^-$, $Br^-$, $I^-$). Exemplary cations 156 having charge transporting properties include tetra aryl ammonium, phosphonium, arsonium, and antimonium cations. Exemplary embodiments of salt ligands 152 are shown below in Formula 1, which include anions $X^-$ such as, but not limited to: $F^-$, $Cl^-$, $Br^-$, $I^-$, and cations such as, but not limited to: tetra aryl ammonium, tetra aryl phosphonium, tetra aryl arsonium, tetra aryl antimonium ions.

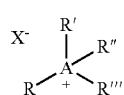

Formula 1

The tetra aryl cations can include: four equal aryl groups R, R', R", R'"; three equal aryl groups R, R', R" and one different aryl group R'"; two equal aryl groups R, R' and two equal aryl groups R", R'" that are different than the aryl groups R, R'; one aryl group R, one aryl group R' that is different than R, and two aryl groups R", R'" that are different than R and R'; or one aryl group R, one aryl group R' that is different than R, one aryl group R" that is different than R, R', and one aryl group R'" that is different than R, R', R". Exemplary aryl moieties that may provide charge transporting properties include, but are not limited to, unsubstituted or substituted phenyl groups, tertiary, secondary, and primary aromatic or aliphatic amines, tryaryl phosphines, and quinolinolates all linked at the para, meta or orto position. In some embodiments, A can be, for example, N, P, As, Sb, etc.; and R, R', R", and R'" may be, phenyl, phenyl methyl, phenyl methoxy, etc.

In some embodiments, the cation of the salt ligand has hole transporting properties. In some embodiments, the cation of the salt ligand has electron transporting properties. In some embodiments, the cation of the salt ligand has both hole transporting properties and electron transporting properties. This type of cation having both hole transporting and electron transporting properties may be referred to as having ambipolar transporting properties.

In some embodiments, and as shown in FIG. 1, one or more types of additional salts 158 composed of small anions 160 and small cations 162 may be introduced with the ligand system. Introduction of the one or more types of additional salts 158 may further balance the charges of the salt ligands 152 and stabilize the system. Exemplary anions 160 of the additional salts 158 include one or more halogen ions (e.g., $F^-$, $Cl^-$, $Br^-$, $I^-$). In some embodiments, the anions 160 may be the same as the anions 154. In other embodiments, the anions 160 may be different than the anions 154. Exemplary small cations 162 include alkali, alkaline earth, and transition metals. Exemplary additional salts 158 include NaCl and/or LiCl.

In some embodiments, the one or more additional salts 158 may be included when the small anion 154 and a cation 156 of the salt ligand 152 have a large difference in size. Due to the charge transporting property, in some embodiments, the cations 156 may be considerably larger than the anions 154. For this reason, when this salt 152 acts as the ligand of the quantum dot 100, the cations 156 may be too large to pack close to the small anions 154 and equilibrate their charges. However, the additional salt 158, which is relatively smaller in size, may be introduced so that the small cations 162 can get closer to the surface of the shell 104 and balance the partial charges of the small anions 154.

In embodiments where ligand exchange is performed in solution, the ligand system (e.g., one or more salt ligands 152 and one or more additional salts 158, if included) may be introduced in a solution of quantum dots 140 having an initial ligand 142. The ligand exchange occurs when the salt ligand 152 is more stable with the quantum dots and replaces the initial ligand 142. The initial ligand 142 goes into solution, and the solution that contains the initial ligand is then removed and more solvent is added.

In embodiments where ligand exchange is performed in the solid state when a film of quantum dots with an initial ligand is deposited, the film may be exposed for a predetermined time to a solution containing the ligand system (e.g., one or more salt ligands 152 and one or more additional salts 158, if included). If the salt ligand 152 is more stable with the quantum dots, it will replace the initial ligand 142 that can be washed away with a solvent. Depending on the thickness of the film of quantum dots and on the exposure time to the new ligand solution, the ligand exchange can occur just on the surface exposed to the new ligand solution or can involve the quantum dots throughout the thickness of the film.

Using the above-described techniques, ligands can also be exchanged asymmetrically. For example, a salt ligand 152 can be deposited on a substrate. Then quantum dots with an initial ligand 142 can be deposited on top of the salt ligand 152. If the salt ligand 152 is more stable of the initial ligand 142, ligand exchange may occur on the side of the thin film that is in contact with the new ligand. If applicable, a second salt ligand 152 can now be replaced on the exposed side of the quantum dot thin film as described above. In some embodiments, the second salt ligands may be different than the first salt ligands. Ligands can be also exchanged layer-by-layer in the solid state, depositing subsequent thin films including quantum dots (e.g., the same quantum dots or different quantum dots) and exchanging the ligands after each deposition. Furthermore, depositing layer-by-layer quantum dots with the different layers having different ligands previously exchanged in solution may result in deposition of an asymmetric thin film of quantum dots with different ligands.

In still other exemplary embodiments, a first salt ligand may be introduced during ligand exchange in solution, the quantum dots including the first salt ligand are deposited to form a quantum dot film, and a second salt ligand may be exchanged in the quantum dot film in the solid state. In still other exemplary embodiments, the first salt ligand can be deposited onto the substrate before the quantum dots, the second ligand can be introduced prior to deposition of the quantum dots during a ligand exchange in solution, then quantum dots are deposited onto the substrate to form a quantum dot film (ligand exchange will happen only in the side of ligand in contact with the first deposited salt).

In some embodiments, the quantum dots of the present disclosure may provide for improved packing in the solid state. Small ligands may allow for dense packing; and the small size and the ionic nature of the ligands may allow the filling of the voids between quantum dots. Small ligands may also allow for increased defect coverage of quantum dots surface due to the small size and the ionic nature of the ligands (i.e. more ligands can coordinate onto a quantum dot).

Figure 2:
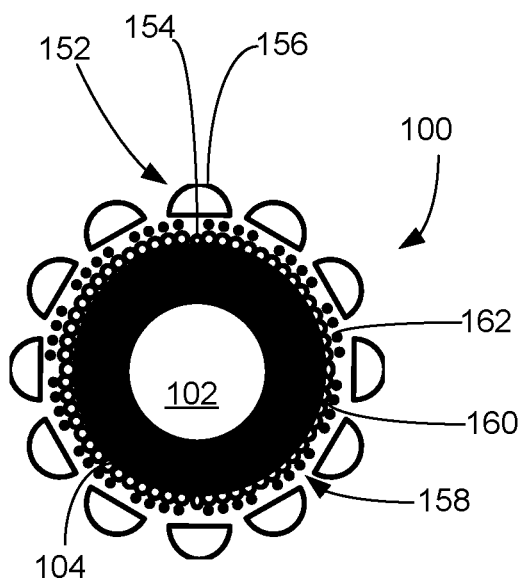
FIGS. 2-5 are schematic illustrations of exemplary quantum dots in accordance with the present disclosure.

FIG. 2 is a schematic illustration of an exemplary quantum dot 100 in accordance with the present disclosure. As shown, the quantum dot 100 is a core-shell quantum dot that includes nanocrystalline core 102, shell 104, salt ligands 152 composed an anion 154 and cation 156, and additional salts 158 composed of an anion 160 and small cation 162. The core 102, shell 104, salt ligand 152, and additional salt 158 may respectively be any of the exemplary cores 102, shells 104, salt ligands 152, and additional salts 158 described above. The exemplary quantum dot 100 may be produced in accordance with the ligand exchange described with respect to FIG. 1. For example, the quantum dot 100 shown in FIG. 2 is the same as the exemplary quantum dot 100 shown in FIG. 1.

Figure 3:
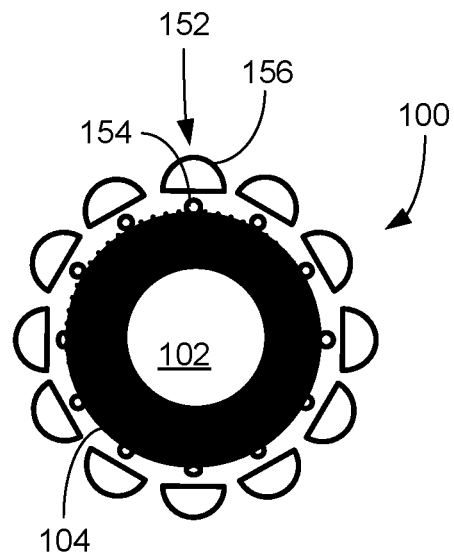

It will be appreciated in other embodiments, the quantum dot 100 including the salt ligands 152 may have a different configuration, and that this configuration may be provided at least in part by the ligand system used in the ligand exchange. For example, while FIG. 1 shows the exemplary inclusion of the additional salt 158 with the ligand system (and FIG. 2 shows the a quantum dot 100 including the additional salt), in other embodiments the additional salt may not be included. For example, only the salt ligand 152 including the small anion 154 and cation 156 may be included with the ligand system. An example of a resultant quantum dot using this ligand system is schematically shown in FIG. 3, where only the salt ligands 152 are present. The core 102, shell 104, and salt ligand 152 may respectively be any of the exemplary cores 102, shells 104, and salt ligands 152 described above.

Figure 4:
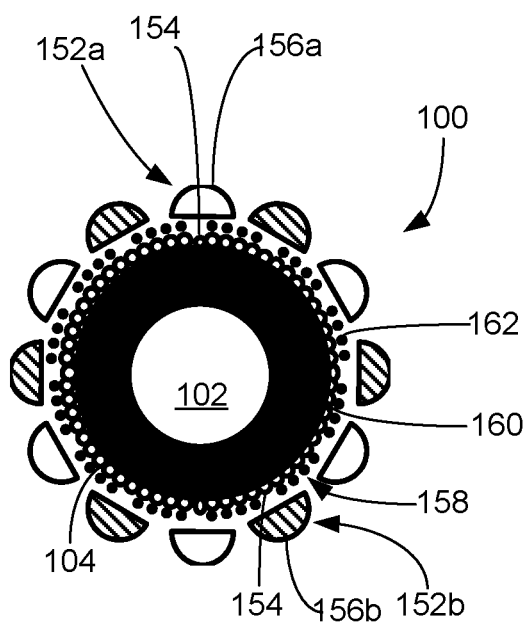
Figure 5:
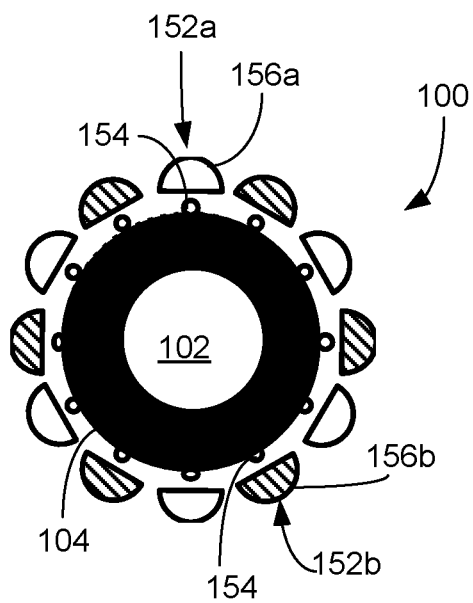

In some embodiments, as described above, the ligand system can be composed of two or more different types of salt ligands 152. In some embodiments, these two or more types of salt ligands 152 may have different types of small anions 154 and/or different types of cations 156. In other embodiments, these two or more salt ligands 152 may have the same type of small anion 154 but two or more different cations 156. In such embodiments, the different cations 156 may have different respective properties. This is exemplified by the exemplary quantum dots shown in FIGS. 4 and 5. FIG. 4 shows a quantum dot similar to that shown in FIG. 2, but includes two types of salts 152a, 152b. In this exemplary embodiment, the cations 156a, 156b of the two types of salts 152a, 152b are different. The core 102, shell 104, salt ligand 152, and additional salt 158 may respectively be any of the exemplary cores 102, shells 104, salt ligands 152, and additional salts 158 described above. FIG. 5 shows a quantum dot similar to that shown in FIG. 3, but includes two types of salts 152a, 152b. In this exemplary embodiment, the cations 156a, 156b of the two types of salts 152a, 152b are different. The core 102, shell 104, and salt ligand 152 may respectively be any of the exemplary cores 102, shells 104, and salt ligands 152 described above.

By utilizing the ligand system of the present disclosure, the salt ligand 152 (or two or more different salt ligands 152) may enhance one or more properties and/or introduce one or more new properties in the quantum dots. For example, in some embodiments, charge transporting properties can be introduced. When quantum dots are deposited as a film, the resulting film may have hole and/or electron charge properties. In another example, the solubility of the quantum dots in a particular solvent can be introduced or enhanced. Quantum dots with typical oleic acid or trioctylphosphine oxide ligands are soluble in apolar solvents. Introducing salts as a ligand can change the solubility of quantum dots towards more polar solvents (e.g., methanol, ethanol, isopropanol, water, dimethylformamide, etc). Also, when the ligand system includes two or more salts, the salts may have different respective properties such that the collective ligand system can be used to impart the quantum dots with different desired properties.

For example, in some embodiments, quantum dots having two different salt ligands 152a, 152b with different charge transporting properties may be provided. In some embodiments, different charge transport properties can be provided with different salts each having the same type of anion. In other embodiments, different charge transport properties can be provided with the different salts having different respective anions. The first salt ligand may have a cation with hole transporting properties and the second salt ligand may have a cation with electron transporting properties. In this way, the quantum dots can have a particular intrinsic charge transporting characteristic that is tuned for a specific QD-LED structure. In some embodiments, if the QD-LED structure would otherwise not be properly balanced having better hole than electron transporting characteristics, the ligands of the quantum dots can include an unbalanced electron transporting characteristic to balance the overall charges that reach the quantum dots. Similarly, in some embodiments if the QD-LED structure would otherwise not be properly balanced having better electron than hole transporting characteristics, the ligands of the quantum dots can include an unbalance hole transporting characteristic to balance the overall charges that reach the quantum dots.

With reference to Formula 1, exemplary aryl moieties that may provide hole transporting properties include, but are not limited to, unsubstituted or substituted phenyl groups, tertiary, secondary, and primary aromatic or aliphatic amines, tryaryl phosphines, fluorenes, carbazoles and quinolinolates all linked at the para, meta or orto position. Exemplary aryl moieties that may provide electron transporting properties include, but are not limited to, unsubstituted or substituted triazines, pyrimidines, pyridines, benzoimidazoles, phenanthrolines, aryl phosphine oxides; aryl silanes, quinolines, condensates polycyclic aromatics (e.g. anthracenes, phenanthrenes, triphenylenes, pyrenes, etc.), fluorenes, all linked at the para, meta or orto position.

In another example, two salt ligands 152a, 152b may be provided, each of the two salt ligands having the same type of anion and a different respective cation: one cation that has charge transport properties (hole or electron transporting properties) and another cation that enhances the solubility of the quantum dots. In another example, two salts may be provided, each of the two salts having a different respective anion and a different respective cation: One cation that has charge transport properties (hole or electron transporting properties) and another cation that enhances the solubility of the quantum dots. In some embodiments, the cation with charge transport properties may actually decrease the solubility of quantum dots in common apolar solvents (e.g., exane, octane, etc.). However, the introduction of cations such as, but not limited to, tetra alkyl ammonium, tetra alkyl phosphonium, tetra alkyl arsonium, tetra alkyl antimonium ions; can restore the solubility of the quantums in apolar solvent and make them soluble also in polar solvents (e.g. methanol, ethanol, dimethylformamide, water, etc.).

In another example, two salt ligands 152a, 152b may be provided, each of the two salts having the same type of anion and a different respective cation: one cation that has charge transport properties and another cation that can be cross-linked (e.g., via external energy stimuli such as pressure, light such as UV, heat, and/or change in pH). In another example, two salt ligands may be provided, each of the two salts having a different respective anion and a different respective cation: one cation that has charge transport properties and another cation that can be cross-linked (e.g., via external energy stimuli such as pressure, light such as UV, heat, and/or change in pH). In some embodiments, one or more functional groups can be included in one or more ends of the cation. Examples of cross-linkable functional groups include, but are not limited to: oxetane, epoxy, thiol, alkene, alkyne, ketone, aldehyde, imide, diazirine, aryl azide, carbodiimide, NHS ester, imidoester, pentafluorophenyl ester, hydroxymethyl phosphines, maleimide, haloacetyl (bromo- or iodo-), thiosulfonate, vinylsulfone, hydrazide, alkoxyamine, isocyanate units.

In some embodiments, the salt ligand that can be cross-linked may also provide charge transport properties. Also, in some embodiments, the salt ligand that can be crosslinked and also may provide charge transport properties may be combined with a salt ligand that may enhance solubility. Accordingly, in some embodiments, while the anions of the two salt ligands may be the same or different (e.g., F$^-$, Cl$^-$, Br$^-$, or I$^-$), the cations of the two salt ligands 152a, 152b may have a respective configuration such as one of the following: one with hole transport properties, and one with hole transport and cross-linkable properties; one with electron transport properties, and one hole transport and cross-linkable properties; one with electron transport properties, and one with electron transport and cross-linkable properties; one with hole transport properties, and one with electron transport and cross-linkable properties; one that enhances solubility, and one with hole transport and cross-linkable properties; and one that enhances solubility, and one with electron transport and cross-linkable properties.

The use of ligands with cross-linkable units may provide one or more advantages. For example, when ligands with cross-linkable units are used, the morphology of the emissive layer may be controlled to a greater extent: The morphology can be modified by ligand arrangement, changing UV exposure times, UV-intensity, amount of photo-initiator and ratio between UV-reactive moieties. In another example, when ligands with cross-linkable units are used, it allows a simplified fabrication process (e.g. UV lithography) to create a high resolution structure in which sub-pixels are small. Conventional methods such as inkjet printing are not suitable to obtain small sub-pixels. In another example, when ligands with cross-linkable units are used, it promotes stability of the UV crosslinked matrix under ambient illumination. For conventional devices, UV light present as part of ambient light (e.g. the emission received from the sun) may promote slow and constant formation/reparation of polymer bonds and cross-linkage. In another example, when ligands with cross-linkable units are used, quantum dots can be dispersed in an organic matrix that protects quantum dots from moisture, humidity and reactive oxygen species (e.g. peroxides, superoxide, hydroxyl radical, and singlet oxygen), thereby reducing the rate of common degradation mechanism for quantum dots which can result in QD-LED exhibiting a change in light output during ageing either with or without electrical bias applied.

In some embodiments, each of these aforementioned combinations of salt ligands 152a, 152b may be further combined with one or more additional salts. Furthermore, the salt ligands 152a, 152b and additional salt 158 (if present) may respectively be any of the exemplary salt ligands 152 and additional salts 158 described above. The exemplary quantum dot 100 may also be produced in accordance with the ligand exchange described with respect to FIG. 1.

The quantum dots as described in the embodiments above may be produced by a ligand exchange process. In some embodiments, the one, two, or more salt ligands are introduced by ligand exchange in solution (e.g., before formation of a quantum dot film). In other embodiments, the one, two, or more salt ligands are introduced by ligand exchange in solid state (e.g., after or at the time of formation of a quantum dot film). In other embodiments, one or more of the salt ligands are introduced by ligand exchange in solution (e.g., before formation of a quantum dot film), and one or more of the salt ligands are introduced in the solid state (e.g., after or at the time of formation of a quantum dot film).

The quantum dots of the present disclosure including the one or more salt ligands may be included, for example, in the emissive layer of a QD-LED structure.

Figure 6:
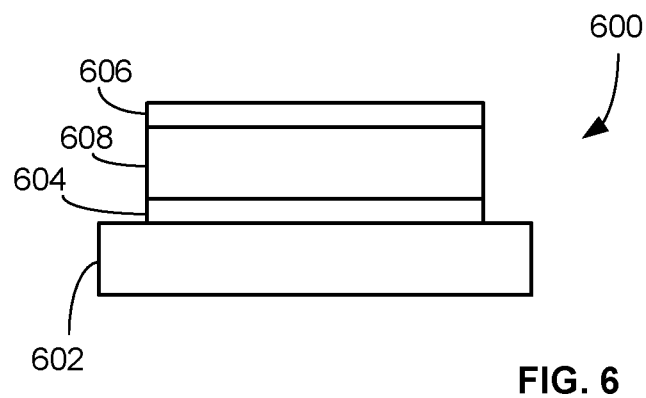
FIG. 6 is a schematic cross-sectional view of an exemplary light-emitting device in accordance with the present disclosure.

Referring to FIG. 6, an exemplary light-emitting device is indicated generally by reference numeral 600. As shown, a stack of layers is provided on a substrate 602. The layers include electrodes 604, 606 and an emissive layer 608 disposed between the electrodes. In some embodiments, such as the one shown, the stack is formed such that the anode is proximate the substrate. Accordingly, in the illustrated embodiment, the order of the layers moving away from the substrate 602 is an anode 604, emissive layer 608, and cathode 606. Although not specifically shown, in other embodiments, the layers may be stacked on the substrate in reverse order such that the cathode is proximate the substrate. During operation, a bias may be applied between the anode 604 and the cathode 606. The cathode 606 injects electrons into the emissive layer 608. Likewise, the anode 604 injects holes into the emissive layer. The electrons and holes radiatively recombine and light is emitted.

The substrate 602 may be made from any suitable material(s). Exemplary substrates include glass substrates and polymer substrates. More specific examples of substrate material(s) include polyimides, polyethenes, polyethylenes, polyesters, polycarbonates, polyethersulfones, polypropylenes, and/or polyether ether ketones. The substrate 602 may be any suitable shape and size. In some embodiments, the dimensions of the substrate allow for more than one light-emitting device to be provided thereon. In an example, a major surface of the substrate may provide an area for multiple light-emitting devices to be formed as sub-pixels of a pixel. In another example, a major surface of the substrate may provide an area for multiple pixels to be formed thereon, each pixel including a sub-pixel arrangement of light-emitting devices.

The electrodes 604, 606 may be made from any suitable material(s). In some embodiments, at least one of the electrodes is a transparent or semi-transparent electrode. In some embodiments, at least one of the electrodes is a reflective electrode. In some embodiments, one of the electrodes is a transparent or semi-transparent electrode and the other electrode is a reflective electrode. Exemplary electrode materials include one or more metals (e.g., aluminum, gold, silver, platinum, magnesium and the like and alloys thereof)

or metal oxides (e.g., indium tin oxide, indium-doped zinc oxide (IZO), fluorine doped tin oxide (FTO), aluminum-doped zinc-oxide (AZO), indium-doped cadmium-oxide, and the like). The electrodes 604, 606 may also be provided in any suitable arrangement. As an example, the electrodes 604, 606 may address a thin-film transistor (TFT) circuit.

The emissive layer 608 may include one or more types of the salt ligand-containing quantum dots described above. In some embodiments, at least a portion of the quantum dots containing the salt ligands are crosslinked and may form a conductive insoluble matrix. The term "insoluble", as used herein in connection with "insoluble matrix", is indicative of the matrix being insoluble in the solvent in which the quantum dots are initially dispersed during formation of the emissive layer, or in a solvent having similar properties to those used to disperse the quantum dots. Such similar solvents may have one or more similar properties such as polarity (dielectric constant), protic-aprotic property, and the like. The similar solvent may be an "orthogonal solvent" in that it is does not dissolve the matrix deposited from the other solvent. As such, the conductive insoluble matrix may be insoluble in orthogonal solvents.

Figure 7A:
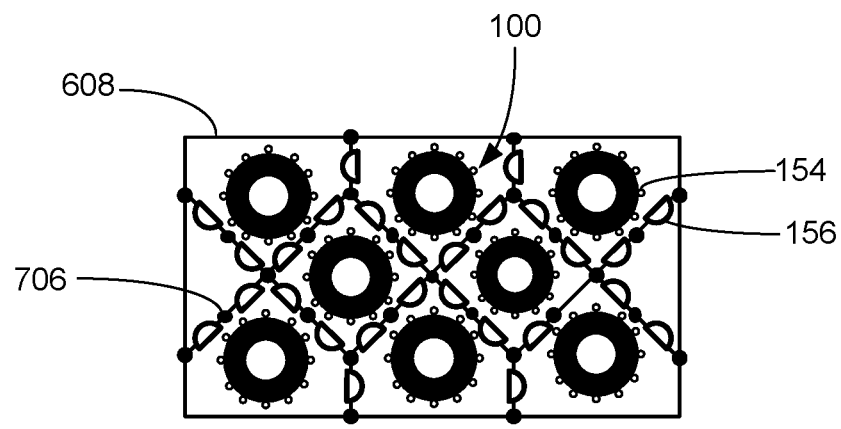
FIG. 7A is a schematic cross-sectional view of an exemplary crosslinked emissive layer in accordance with the present disclosure.

An exemplary matrix structure is schematically shown in FIG. 7A. In the exemplary embodiments shown, cations of these cross-linkable salt ligands are joined together to form the matrix. In FIG. 7A, the cations 156 are schematically shown as being joined to one another at respective bond locations 706 to form the matrix.

In some embodiments, the cross-linkable ligands are composed of at least two moieties with different characteristics. One part of the molecule may have charge transporting properties and another one may provide cross-linking capabilities. Moieties such as, but not limited to: quaternary, tertiary and secondary aromatic ammonium, phosphonium, arsonium, antimonium salts provide charge transporting properties and oxetane, epoxy, thiol, alkene, alkyne, ketone, aldehyde, imide, diazirine, aryl azide, carbodiimide, NHS ester, imidoester, pentafluorophenyl ester, hydroxymethyl phosphines, maleimide, haloacetyl (bromo- or iodo-), thiosulfonate, vinylsulfone, hydrazide, alkoxyamine, isocyanate units may provide cross-linking capabilities. In some embodiments, the two units are connected and between them there may be a distance of less than 20 nm.

In some embodiments, one or more auxiliary salt ligands may be included in the matrix structure. Although not specifically shown in FIG. 7A, the one or more auxiliary salt ligands may be located between the anions and cations of the crosslinked salt quantum dots. The one or more auxiliary salt ligands may help to fill voids in the matrix material and may provide one or more additional properties, such as charge transporting properties, in the matrix structure. The inclusion of auxiliary salt ligands is exemplified in the process described below with respect to FIGS. 12A-12E.

It will be appreciated that in some embodiments, the emissive layer may include more than one type of quantum dot (e.g., having different respective ligands, having different respective anions, having different respective cations, having different respective additional salts, the presence/absence of an additional salt, etc.). It will further be appreciated that in some embodiments, a combination of cross-linkable salt ligand-containing quantum dots and non-cross-linkable quantum dots may be included in the matrix structure. Accordingly, although not specifically shown, the matrix structure may include several quantum dots that do not have cations joined to other cations in formation of the matrix.

Figure 7B:
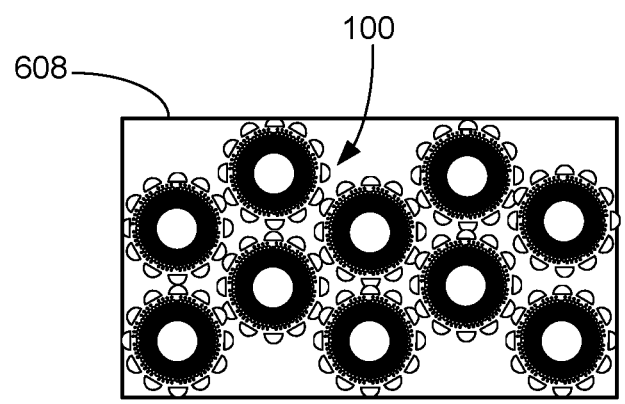
FIG. 7B is a schematic cross-sectional view of an exemplary emissive layer in accordance with the present disclosure.
Figure 8:
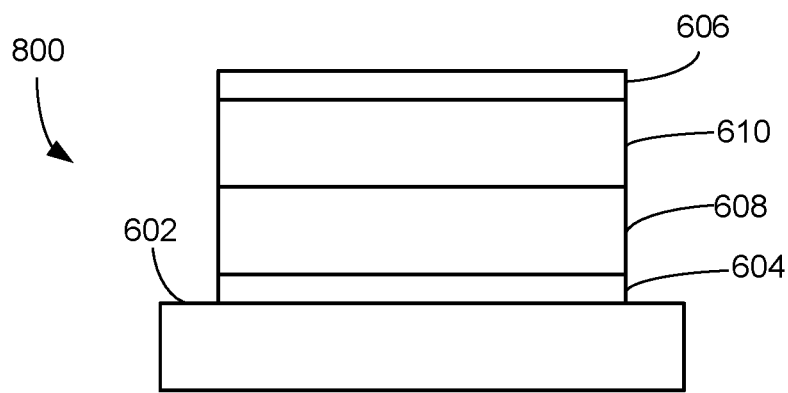
FIGS. 8-10 are schematic cross-sectional views of exemplary light-emitting devices in accordance with the present disclosure.

In other embodiments the one or more types of the salt ligand-containing quantum dots included in the emissive layer 608 are not crosslinked. In such embodiments, the one or more types of the salt ligand-containing quantum dots may not be cross-linkable (e.g., may not include cross-linkable salt ligands) and/or may be cross-linkable (e.g., may include one or more types of cross-linkable salt ligands) but have not actually been crosslinked. As such, and as schematically shown in FIG. 7B, the emissive layer may be formed by the one or more types of the salt ligand-containing quantum dots in a packed arrangement. FIG. 8 shows another exemplary embodiment of a light-emitting device 800. The light-emitting device is similar to the light-emitting device 600 described above, but it additionally includes an electron transport layer 610. As shown, a stack of layers is provided on a substrate 602. The layers include electrodes 604, 606, an emissive layer 608, and an electron transport layer 610. Both the emissive layer 608 and the electron transport layer 610 are disposed between the electrodes, with the emissive layer 608 proximate the anode 604 and the electron transport layer 610 proximate the cathode 606. In some embodiments, such as the one shown, the stack is formed such that the anode is proximate the substrate. Although not specifically shown, in other embodiments, the layers may be stacked on the substrate in reverse order such that the cathode is proximate the substrate. During operation, a bias may be applied between the anode 604 and the cathode 606. The structure may provide for recombination of holes and electrons in a portion of the emission layer 108 proximate the interface of the emission layer 608 and the electron transport layer 610.

The electrodes 604, 606 and the emissive layer 608 may be embodied as any of the embodiments described above (e.g., in connection with FIGS. 6, 7A, and 7B).

The electron transport layer 610 may include one or more layers configured to transport electrons therethrough from the cathode to the emissive layer. The electron transport layer 610 may be made from any suitable material(s). In some embodiments, the electron transport layer 610 may include one or more of ZnO, 8-quinolinolato lithium (Liq.), LiF, $Cs_2CO_3$, $Mg_xZn_{1-x}O$ where $0 \leq x \leq 1$, $Al_xZn_{1-x}O$ where $0 \leq x \leq 1$, 2,2',2"-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), and 9,9-Bis[4-[(4-ethenylphenyl)methoxy]phenyl]-N2,N7-di-1-naphthalenyl-N2,N7-diphenyl-9H-Fluorene-2,7-diamine (VB-FNPD). In embodiments where the electron transport layer 610 includes more than one layer, the material of one of the respective layers may differ from the material of one or more of the other layers(s).

In some embodiments, the electron transport layer does not include a cross-linkable transport material. In other embodiments, the electron transport material includes one or more cross-linkable transport materials. In embodiments where the electron transport material includes one or more cross-linkable transport materials, the crosslinked matrix within the emissive layer may be crosslinked to (and extend into) the electron transport layer. This crosslinking is exemplified in FIG. 11. As shown, the charge transport materials 1102 are joined at respective bond locations 1106 to form the matrix, which are joined to cations 156 of the cross-linkable salt ligands in the emissive layer 608.

Figure 9:
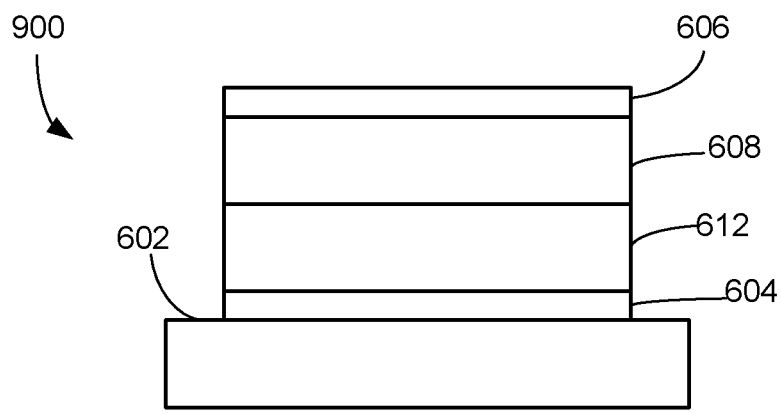

FIG. 9 shows another exemplary embodiment of a light-emitting device 900. The light-emitting device 900 is similar to the light-emitting device 600 described above, but it additionally includes a hole transport layer 612. As shown, a stack of layers is provided on a substrate 602. The layers include electrodes 604, 606, an emissive layer 608, and a hole transport layer 612. Both the emissive layer 608 and the hole transport layer 612 are disposed between the electrodes, with the emissive layer 608 proximate the cathode 606 and the hole transport layer 612 proximate the anode 604. In some embodiments, such as the one shown, the stack is formed such that the anode is proximate the substrate. Although not specifically shown, in other embodiments, the layers may be stacked on the substrate in reverse order such that the cathode is proximate the substrate. During operation, a bias may be applied between the anode 604 and the cathode 606. The structure may provide for recombination of holes and electrons in a portion of the emission layer 608 proximate the interface of the emission layer 608 and the hole transport layer 612.

The electrodes 604, 606 and the emissive layer 608 may be embodied as any of the embodiments described above (e.g., in connection with FIGS. 6, 7A, and 7B).

The hole transport layer 612 may include one or more layers configured to transport holes therethrough from the anode to the emissive layer. The hole transport layer 606 may be made from any suitable material(s). In some embodiments, the hole transport layer 612 may include one or more of poly(3,4-ethylenedioxythiophene): poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N, N'-bis(4-butylphenyl)-N, N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4, N4'-Bis(4-(6-((3-ethyloxetan-3-yl)methoxy)hexyl)phenyl)-N4, N4'-diphenylbiphenyl-4,4'-diamine (OTPD), N4, N4'-Bis(4-(6-((3-ethyloxetan-3-yl)methoxy)hexyloxy)phenyl)-N4, N4'-bis(4-methoxyphenyl)biphenyl-4,4'-diamine (QUPD), and N,N' -(4,4'-(Cyclohexane-1,1-diyl)bis(4,1-phenylene))bis(N -(4-(6-(2-ethyloxetan-2-yloxy)hexyl)phenyl)-3,4,5-trifluoroaniline) (X-F6-TAPC). In embodiments where the hole transport layer 112 includes more than one layer, the material of one of the respective layers may differ from the material of one or more of the other layers(s).

In some embodiments, the hole transport layer does not include a cross-linkable transport material. In other embodiments, the hole transport material includes one or more cross-linkable transport materials. In embodiments where the hole transport material includes one or more cross-linkable transport materials, the crosslinked matrix within the emissive layer may be crosslinked to (and extend into) the hole transport layer. This crosslinking is exemplified in FIG. 11. As shown, the charge transport materials 1102 are joined at respective bond locations 1106 to form the matrix, which are joined to cations 156 of the cross-linkable salt ligands in the emissive layer 608.

Figure 10:
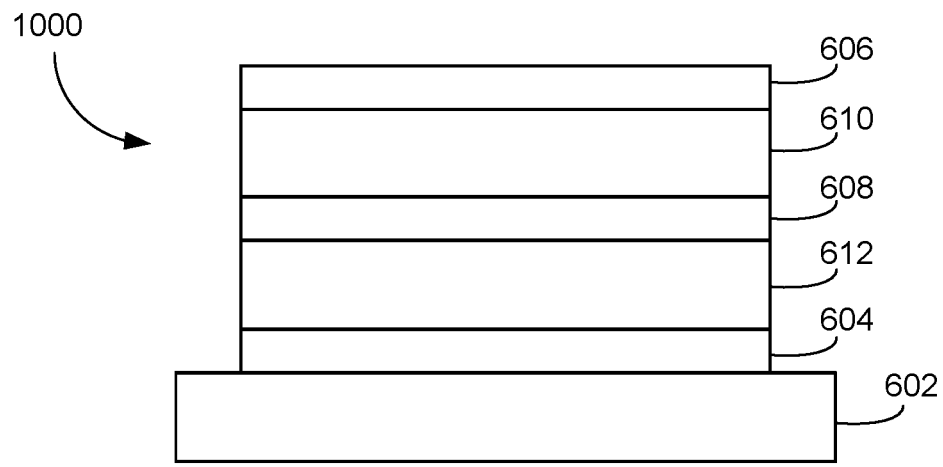

FIG. 10 shows another exemplary embodiment of a light-emitting device 1000. The light-emitting device 1000 is similar to the light-emitting device 600 described above, but it additionally includes a hole transport layer 612 and an electron transport layer 610. As shown, a stack of layers is provided on a substrate 602. The layers include electrodes 604, 606; charge transport layers 610, 612; and an emissive layer 608. In the exemplary embodiment shown, the charge transport layers 610, 612 are disposed between the electrodes 604, 606 and the emissive layer 608 is disposed between the charge transport layers 610, 612.

In some embodiments, such as the one shown, the stack is formed such that the anode is proximate the substrate. Accordingly, in the illustrated embodiment, the order of the layers moving away from the substrate is an anode 604, hole transport layer 612, emissive layer 608, electron transport layer 610, and cathode 606. Although not specifically shown, in other embodiments, the layers may be stacked on the substrate in reverse order such that the cathode is proximate the substrate. During operation, a bias may be applied between the anode 604 and the cathode 606. The cathode 606 injects electrons into the electron transport layer 610 adjacent to it. Likewise, the anode 604 injects holes into the hole transport layer 612 adjacent to it. The electrons and holes respectively propagate through the hole transport layer and the electron transport layer to the emissive layer 608 where they radiatively recombine and light is emitted.

The electrodes 604, 606 and the emissive layer 608 may be embodied as any of the embodiments described above (e.g., in connection with FIGS. 6, 7A, 7B, 8, and 9). The electron transport layer 610 may be embodied as any of the embodiments described above (e.g., in connection with the embodiment of FIG. 8). The hole transport layer 612 may be embodied as any of the embodiments described above (e.g., in connection with the embodiment of FIG. 9).

In still other embodiments, the light-emitting device may include one or more additional layers. Examples include a hole injection layer (e.g., between the anode and the hole transport layer) and/or an electron injection layer (e.g., between electron transport layer and the cathode). Exemplary materials suitable for use in a hole injection layer include, but are not limited to, poly(3,4-ethylenedioxythiophene) polystyrene sulfonate (PEDOT:PSS), $MoO_3$:PEDOT:PSS; $V_2O_5$, $WO_3$, $MoO_3$, 2,3,5,6-tetrafluoro-7,7,8,8-tetracyanoquinodimethane (F4TCNQ), and/or 1,4,5,8,9,11-hexaazatriphenylenehexacarbonitrile (HATCN). Exemplary materials suitable for use in an electron injection layer include, but are not limited to, 8-quinolinolato lithium (Liq), LiF, and/or $Cs_2CO_3$.

Figure 11:
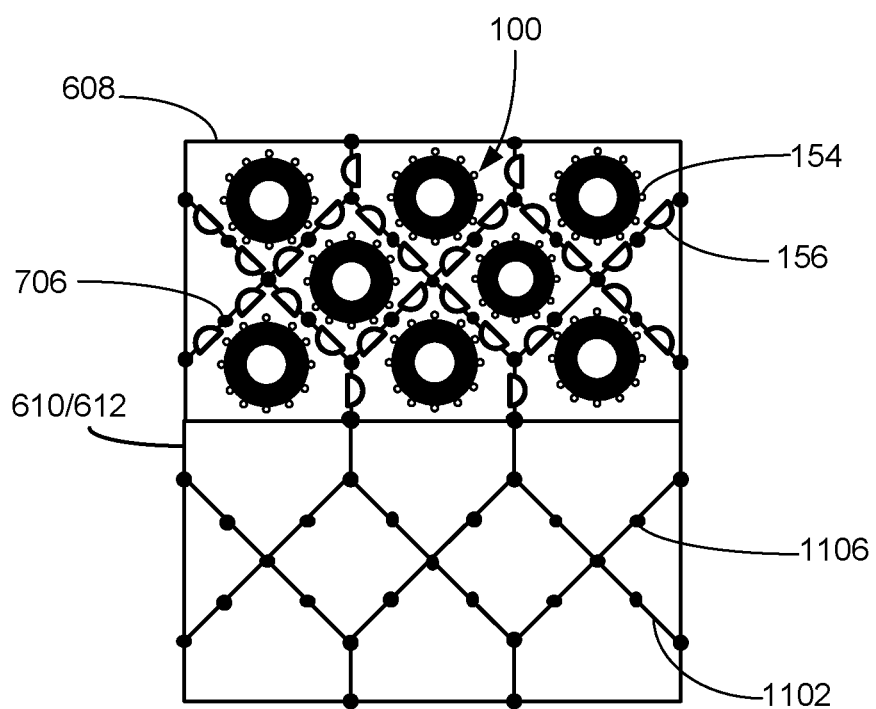
FIG. 11 is a schematic cross-sectional view of parts of a crosslinked emissive layer in accordance with the present disclosure crosslinked together with an adjacent charge transport layer.

As exemplified in the embodiments described in connection with FIGS. 8-10, the emissive layer 608 may be adjacent a hole transport layer 612 and/or an electron transport layer 610. In some embodiments, the electron transport layer 610 and/or the hole transport layer 612 does not include a cross-linkable transport material. In other embodiments, the electron transport material of the electron transport layer 610 and/or the hole transport material of the hole transport layer 612 includes one or more cross-linkable transport materials. As such, in some embodiments, the crosslinked matrix within the emissive layer may be crosslinked to (and extend into) the electron transport layer 610 and/or the hole transport layer 612. This is exemplified in FIG. 11, which shows a cross-sectional view of exemplary interactions occurring using an additional cross-linkable material as charge transport material in the adjacent charge transport layer 610/612, where the structure of the emissive layer 608 is similar to that described in connection with FIG. 7A. Interactions at the interfaces between charge transport layer and the emissive layer promote anchoring between the adjacent layers. While FIG. 11 shows the crosslinking between two adjacent layers, although not specifically shown, in some embodiments (e.g., such as that in FIG. 10 where the emissive layer 608 is adjacent both the electron transport layer 610 and the hole transport layer 612) the emissive layer 608 may be crosslinked with both the electron transport layer 610 and with the hole transport layer 612.

Turning now to FIGS. 12A-12E, an exemplary method of producing the crosslinked emissive layer (or at least a portion thereof) is described. In this embodiment, the emissive layer may be patterned by UV-exposing the desired area of the deposited layer. The patterned emissive layer may then be insoluble in the UV-exposed area and the remaining materials may be removed (e.g., washed away with a solvent).

Figure 12A:
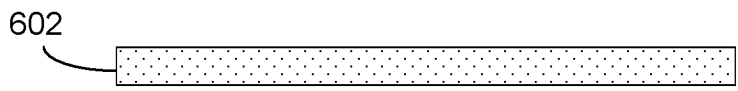
FIGS. 12A-12E are schematic cross-sectional views showing production of parts of an exemplary light-emitting device produced in accordance with an exemplary method of the present disclosure.
Figure 12B:
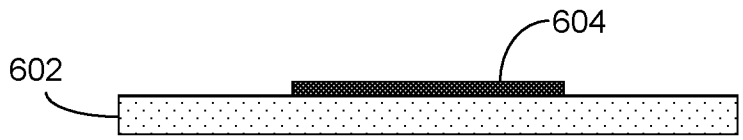

As shown in FIG. 12A, a substrate 602 is provided. As shown in FIG. 12B, an electrode 604 is deposited on the substrate 602. The electrode 604 may be deposited on the substrate using any suitable method. Examples include sputtering, evaporative coating, printing, chemical vapor deposition, and the like. As described above, the deposited electrode may be provided in any suitable form. One exemplary implementation is an electrode for a TFT circuit.

Figure 12C:
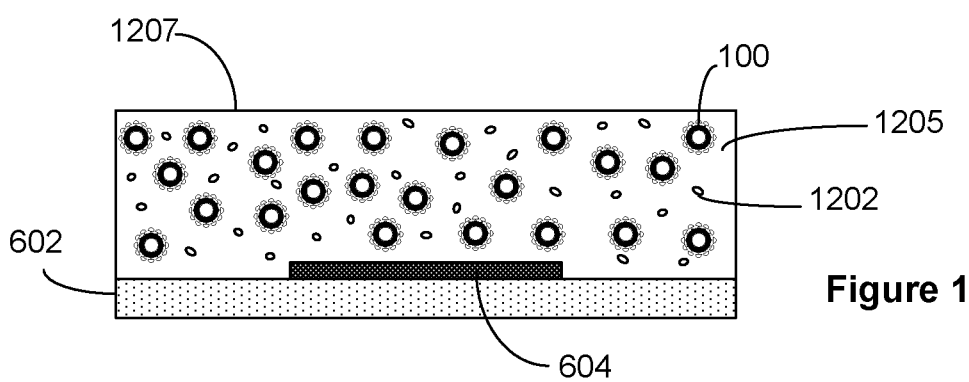

As shown in FIG. 12C, a mixture 1207 including salt ligand-containing quantum dots 100 in a solvent 1205 is deposited on top of the electrode 604 and the substrate 602. In the present embodiment, the salt ligand-containing quantum dots 100 are cross-linkable. In some embodiments, the quantum dots have been subjected to a ligand exchange prior to deposition of the mixture 1207. In other embodiments, the mixture is initially deposited with quantum dots, and at least a portion of the quantum dots are then subjected to a ligand exchange. In the embodiment shown, the mixture 1207 also includes one or more auxiliary salt ligands 1202 having hole transport properties and/or one or more auxiliary salt ligands 1202 having electron transport properties. In some embodiments, the mixture 1207 additionally includes photo initiator (e.g., sulfonium- and iodonium-salts such as triphenylsulfonium triflate and diphenyliodonium triflate, chromophores containing the benzoyl group (benzoin ether derivatives, halogenated ketones, dialkoxyacetophenones, diphenylacetophenones, etc), hydroxy alkyl heterocyclic or conjugated ketones, benzophenone- and thioxanthone-moiety-based cleavable systems (such as benzophenone phenyl sulfides, ketosulfoxides, etc), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, barton's ester derivatives, hydroxamic and thiohydroxamic acids and esters, organoborates, titanocenes, chromium complexes, aluminate complexes, tempo-based alkoxyamines, oxyamines, alkoxyamines, silyloxyamines).

The solvent 1205 may be any suitable solvent. In some embodiments, the solvent 1205 is selected such that the quantum dots (and auxiliary salt ligands and photo initiator, if included) are soluble therein. Exemplary solvents include, but are not limited to the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 10 atoms of carbon (e.g., butanol, 2-propanol, propanol, ethanol, methanol), linear or branched alkoxy alcohols with 2 to 10 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA). The particular solvent that is utilized may depend on the specific quantum dots and photo initiator that are selected.

Figure 12D:
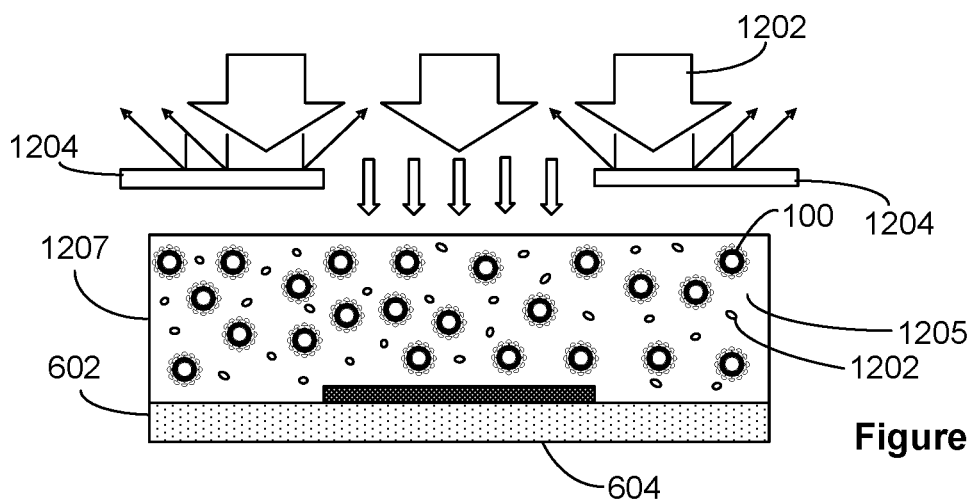
Figure 12E:
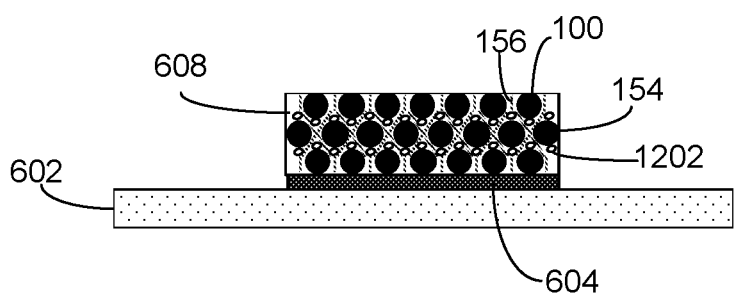

As shown in FIG. 12D, UV light 1102 is applied though a mask 1104 that provides a shape/pattern through which the desired area of the mixture 607 is exposed. Exposure of the mixture 607 to UV light results in the cross-linking of the cations of the quantum dots. In embodiments where the mixture includes photo initiator, the photo initiator may assist in initializing the cross-linking of the cations. The cross-linking of the cations results in dispersion of the quantum dots throughout the formed crosslinked matrix. The crosslinked mixture forms the emissive layer 608. The remaining mixture may be washed away with a solvent; and the emissive layer 608 remains, as it is insoluble in the solvent. In some embodiments, the solvent is the same solvent used in the mixture 607 that is deposited in FIG. 12C. In other embodiments, the solvent is a similar solvent or orthogonal solvent to the solvent used in the mixture 607 that is deposited in FIG. 12C. Accordingly, as shown in FIG. 12E, the crosslinked emissive layer 608 remains on the electrode 602. As shown, the quantum dots are dispersed in the solid matrix formed by crosslinking the cations.

The solvent used in the mixture 1207 and/or the solvent used to wash away the remaining mixture may be evaporated during annealing (e.g., heating) of the deposited layer. The annealing may be performed at any suitable temperature that effectuates evaporation of the solvent while also maintaining the integrity of the quantum dots and charge transport material. In some embodiments, annealing may be performed at a temperature ranging from 5° C. to 150° C. In other embodiments, annealing may be performed at a temperature ranging from 30° C. to 150° C. In other embodiments, annealing may be performed at a temperature ranging from 30° C. to 100° C.

As an example, subsequent to the application of UV light (as shown in FIG. 12D), the layer may be annealed (e.g., heated) to facilitate evaporation/removal of the solvent(s). This annealing may be performed prior to the washing or subsequent to the washing. In those implementations where the annealing is performed prior to the washing, a subsequent annealing may be performed after washing. As another example, application of UV light (as shown in FIG. 12D) and annealing (e.g., heating) may be performed in parallel. This may remove the solvent used in the mixture 1207. Subsequent to the washing, a subsequent annealing may be performed. As yet another example, annealing may be conducted prior application of UV light (as shown in FIG. 12D). Subsequent to the washing, a subsequent annealing may be performed.

Factors such as the UV exposure times, UV-intensity, amount of photo initiator and ratio between UV-reactive moieties may allow for control of the morphology of the emissive material. For example, UV exposure time may in some embodiments range from 0.1 second to 15 minutes. UV exposure intensity may range from 0.1 to 100,000 mJ/cm$^2$. The amount of photo initiator may range from 0.001 to 10 wt % of the mixture. The ratio between UV reactive moieties may range from 0.001 to 1. In one exemplary implementation, the UV exposure intensity ranges from 1 to 100 mJ/cm$^2$ at a UV exposure time of 0.01 to 200 seconds.

Using an approach such as that described above, different subpixels (R, G and B) can be patterned on a given substrate in a manner that delineates the areas where the materials that constitute the QLED subpixel structures are deposited.

Furthermore, in other embodiments, one or more stimuli in addition to or other than UV can be used. Examples include pressure, heat, and change in pH. Accordingly, in some embodiments, the method of producing the crosslinked emissive layer as described in FIGS. 12A-12E may be modified, for example with respect to the step shown in FIG. 12D. For example, instead of the application of UV light, this step may instead or additionally include one or more of application of pressure, increase in temperature, and addition to the mixture 1207 to provide a change in pH. Application of this stimuli may provide for formation of the matrix.

Example—Production of a light-emitting device 150 nm of ITO is sputtered through a shadow mask onto a 1 mm thick glass substrate to define a semi-transparent anode region. PEDOT:PSS in aqueous solution is deposited on top of the anode by spin coating then baked at 150° C. to form a hole injection layer. TFB dissolved in chlorobenzene is deposited on top of the hole injection layer by spin coating then baked at 110° C. to form a hole transport layer. CdSe/CdS quantum dots with two salt ligands and a photo initiator are deposited and patterned by the above-described deposition method exemplified in FIGS. 12A-12E. ZnO nanoparticles are deposited on top of the emissive layer by spin coating from ethanol followed by baking at 110° C. to form an electron transport layer. 100 nm of Aluminium is thermally evaporated on top of the electron transport layer to provide a reflective cathode.

The above-described process yields a light-emitting device having a 1 mm glass substrate, 150 nm ITO anode, 50 nm PEDOT:PSS hole injection layer, 40 nm TFB hole transport layer, 50 nm crosslinked emissive layer having a salt ligand crosslinked matrix within which CdSe/CdS QDs and the other salt ligand are dispersed, 45 nm ZnO electron transport layer, and 100 nm Al cathode.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

The invention claimed is:

1. A quantum dot comprising a salt ligand at an outer surface of the quantum dot, the salt ligand comprising an anion and a cation, the cation having charge transporting properties, wherein the cation comprises tetra aryl ammonium, tetra aryl phosphonium, tetra aryl arsonium, or tetra aryl antimonium.

2. The quantum dot of claim 1, wherein the cation of the salt ligand has hole transporting properties.

3. The quantum dot of claim 2, wherein the cation of the salt ligand comprises a cross-linkable functional group.

4. The quantum dot of claim 3, wherein the cross-linkable functional group comprises oxetane, epoxy, thiol, alkene, alkyne, ketone, aldehyde, imide, diazirinie, aryl azide, carbodiimide, NHS ester, imidoester, pentafluorophenyl ester, hydroxymethyl phosphine, maleimide, haloacetyl bromo thiosulfonate, haloacetyl iodo thiosulfonate, thiosulfonate, vinylsulfonate, hydrazide, alkoxyamine, or isocyanate.

5. The quantum dot of claim 1, wherein the cation of the salt ligand has electron transporting properties.

6. The quantum dot of claim 5, wherein the cation of the salt ligand comprises a cross-linkable functional group.

7. The quantum dot of claim 1, wherein:
the salt ligand is a first salt ligand; and
the quantum dot further comprises a second salt ligand comprising an anion and a cation, the second ligand different than the first salt ligand.

8. The quantum dot of claim 7, wherein:
the anion of the second ligand and the anion of the first ligand are the same type; and
the cation of the second ligand is different than the cation of the first ligand.

9. The quantum dot of claim 7, wherein:
the anion of the second ligand is different than the anion of the first ligand; and
the cation of the second ligand is different than the cation of the first ligand.

10. The quantum dot of claim 7, wherein:
the cation of one of the first ligand and the second ligand has hole transporting properties; and
the cation of the other of the first ligand and the second ligand has solubility properties in a solvent.

11. The quantum dot of claim 7, wherein:
the cation of one of the first ligand and the second ligand has electron transporting properties; and
the cation of the other of the first ligand and the second ligand has solubility properties in a solvent.

12. The quantum dot of claim 7, wherein:
the cation of one of the first ligand and the second ligand has electron transporting properties; and
the cation of the other of the first ligand and the second ligand has hole transporting properties.

13. The quantum dot of claim 7, wherein the cation of one of the first ligand and the second ligand is cross-linkable.

14. The quantum dot of claim 1, further comprising an additional salt at the surface of the quantum dot.

15. A light-emitting device, comprising:
an anode;
a cathode; and
an emissive layer disposed between the anode and the cathode, the emissive
layer comprising quantum dots as described in claim 1.

16. The light-emitting device of claim 15, further comprising a hole transport layer disposed between the anode and the emissive layer, wherein the hole transport layer is crosslinked with at least a portion of the cations of the ligands of the quantum dots.

17. The light-emitting device of claim 15, further comprising an electron transport layer disposed between the cathode and the emissive layer, wherein the electron transport layer is crosslinked with at least a portion of the cations of the ligands of the quantum dots.

18. A method of forming an emissive layer of a light-emitting device, comprising:
depositing a mixture comprising quantum dots on a layer, at least a portion of the quantum dots each comprising a salt ligand at an outer surface of the quantum dot, the salt ligand comprising an anion and a cation, the cation having charge transporting properties, wherein the cation comprises tetra aryl ammonium, tetra aryl phosphonium, tetra aryl arsonium, or tetra aryl antimonium; and subjecting at least a portion of the mixture to external activation stimuli to form the emissive layer comprising the quantum dots dispersed in a crosslinked matrix.

19. The method of claim 18, wherein the external activation stimuli is one or more of light, pressure, temperature, and change in pH.

20. The method of claim 18, wherein the layer is a hole transport layer comprising a cross-linkable hole transport material, and the subjecting the at least a portion of the mixture to external activation stimuli crosslinks the hole transport layer with the matrix of the emissive layer.

* * * * *